US011796594B2

(12) United States Patent
Johansen et al.

(10) Patent No.: US 11,796,594 B2
(45) Date of Patent: Oct. 24, 2023

(54) PWM CAPTURE FUNCTION FOR EVENT ANALYSIS

(71) Applicant: SCHNEIDER ELECTRIC IT CORPORATION, Foxboro, MA (US)

(72) Inventors: Flemming Johansen, Kolding (DK); Lars Opstrup Poulsen, Morud (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 155 days.

(21) Appl. No.: 17/204,355

(22) Filed: Mar. 17, 2021

(65) Prior Publication Data

US 2022/0137136 A1   May 5, 2022

Related U.S. Application Data

(60) Provisional application No. 63/110,167, filed on Nov. 5, 2020.

(51) Int. Cl.
*G01R 31/327*   (2006.01)
*H03K 3/017*   (2006.01)

(52) U.S. Cl.
CPC ......... *G01R 31/3277* (2013.01); *H03K 3/017* (2013.01)

(58) Field of Classification Search
CPC .............. G01R 31/32; G01R 31/3275; G01R 31/3277; H03K 3/017; H02M 7/5395; H02M 1/00; H02M 1/0003; G05B 2219/31034; H02J 3/001
See application file for complete search history.

(56) References Cited

U.S. PATENT DOCUMENTS

| | | | |
|---|---|---|---|
| 7,318,118 B2 | 1/2008 | Chu et al. | |
| 7,360,112 B2 | 4/2008 | Durica et al. | |
| 7,610,445 B1 | 10/2009 | Manus et al. | |
| 10,102,693 B1* | 10/2018 | Wu | G05B 23/0254 |
| 2009/0077302 A1 | 3/2009 | Fukuda | |
| 2011/0302365 A1 | 12/2011 | Heo et al. | |

(Continued)

FOREIGN PATENT DOCUMENTS

| | | |
|---|---|---|
| JP | 2016126645 A | 7/2016 |
| KR | 20060090166 A | 8/2006 |
| KR | 101023883 B1 | 3/2011 |

OTHER PUBLICATIONS

Extended European Search Report from corresponding European Application No. 21206444.8 dated Mar. 23, 2022.

*Primary Examiner* — Son T Le
(74) *Attorney, Agent, or Firm* — Lando & Anastasi, LLP

(57) ABSTRACT

According to one example, an electrical device is provided comprising electrical-device components, a first memory configured to store data temporarily, a second memory, the second memory being non-volatile memory, and a control device configured to acquire data indicative of at least one parameter of at least one electrical-device component of the electrical-device components responsive to a sample condition being met, store the acquired data in the first memory, determine that a fault condition exists based on the acquired data, the fault condition being indicative of a fault of one or more of the electrical-device components, and store the acquired data in the second memory responsive to determining that the fault condition exists.

20 Claims, 10 Drawing Sheets

(56) References Cited

U.S. PATENT DOCUMENTS

| | | | |
|---|---|---|---|
| 2014/0297144 A1* | 10/2014 | Wakao | B60W 50/0205 |
| | | | 701/68 |
| 2015/0077133 A1* | 3/2015 | Fischer | H02H 3/165 |
| | | | 324/537 |
| 2017/0331293 A1 | 11/2017 | Narla | |
| 2020/0021205 A1* | 1/2020 | Nabeshi | B62D 5/046 |

* cited by examiner

PWM CAPTURE FUNCTION FOR EVENT ANALYSIS

CROSS-REFERENCE TO RELATED APPLICATION

This application claims priority under 35 U.S.C. § 119(e) to U.S. Provisional Application Ser. No. 63/110,167, titled "PWM CAPTURE FUNCTION FOR EVENT ANALYSIS," filed on Nov. 5, 2020, which is hereby incorporated by reference in its entirety.

BACKGROUND

1. Field of the Disclosure

At least one example in accordance with the present disclosure relates generally to analyzing electrical-parameter information.

2. Discussion of Related Art

Many electrical devices include electrical switching devices, or "switches." Electrical power converters, for example, may include several switches configured to open or close according to control signals received from a control device. Control signals may include pulse-width modulation (PWM) signals configured to control a state of the switches to which the PWM signals are provided. Operation of an electrical device, such as a power converter, may therefore be controlled based on PWM signals provided to switches in the electrical device.

SUMMARY

According to at least one aspect, an electrical device comprises electrical-device components, a first memory configured to store data temporarily, a second memory, the second memory being non-volatile memory, and a control device configured to acquire data indicative of at least one parameter of at least one electrical-device component of the electrical-device components responsive to a sample condition being met, store the acquired data in the first memory, determine that a fault condition exists based on the acquired data, the fault condition being indicative of a fault of one or more of the electrical-device components, and store the acquired data in the second memory responsive to determining that the fault condition exists.

In various examples, the first memory is a buffer. In at least one example, the buffer is a first-in, first-out buffer. In various examples, the second memory includes ferroelectric random-access memory. In at least one example, the electrical-device components include one or more switching devices. In various examples, the fault condition is indicative of a fault of at least one of the one or more switching devices. In at least one example, the control device is further configured to provide pulse-width modulation (PWM) signals to the one or more switching devices. In various examples, the sample condition includes a transition in at least one PWM signal of the PWM signals.

In at least one example, the sample condition includes a threshold period of time elapsing since previously acquired data indicative of the at least one parameter of the at least one electrical-device component was most recently acquired by the control device. In various examples, the electrical device comprises a microprocessor configured to provide the acquired data to a visualization system to analyze the fault condition. In at least one example, the electrical-device components include a peak-current detector, and wherein the fault condition includes a peak current being exceeded. In various examples, the electrical-device components include a desaturation detector, and wherein the fault condition includes a desaturation condition being detected.

In at least one example, the acquired data indicative of the at least one parameter of the at least one electrical-device component includes at least one of current data, voltage data, or temperature data. In various examples, the electrical-device components include a plurality of switching devices, and wherein the current data is indicative of a current through each switching device of the plurality of switching devices. In at least one example, the electrical-device components include a plurality of switching devices, and wherein the voltage data is indicative of a voltage across each switching device of the plurality of switching devices. In various examples, the temperature data is indicative of an ambient temperature of the at least one electrical-device component of the electrical-device components.

According to at least one aspect, a non-transitory computer-readable medium storing thereon sequences of computer-executable instructions for operating an electrical device having electrical-device components, a first memory configured to store data temporarily, and a second memory is provided, the second memory being non-volatile memory, and the sequences of computer-executable instructions including instructions that instruct at least one device to acquire data indicative of at least one parameter of at least one electrical-device component of the electrical-device components responsive to a sample condition being met, store the acquired data in the first memory, determine that a fault condition exists based on the acquired data, the fault condition being indicative of a fault of one or more of the electrical-device components, and store the acquired data in the second memory responsive to determining that the fault condition exists.

In various examples, the sequences of computer-executable instructions include instructions that instruct at least one processor to provide pulse-width modulation (PWM) signals to one or more switching devices, and wherein the sample condition being met includes a transition in at least one PWM signal of the PWM signals. In at least one example, the sample condition being met includes a threshold period of time elapsing since previously acquired data indicative of the at least one parameter of the at least one electrical-device component was most recently acquired.

According to at least one example, a method of assembling an electrical device is provided comprising providing electrical-device components, a first memory configured to store data temporarily, and a second memory, the second memory being non-volatile memory, providing a control device configured to acquire data indicative of at least one parameter of at least one electrical-device component of the electrical-device components responsive to a sample condition being met, store the acquired data in the first memory, determine that a fault condition exists based on the acquired data, the fault condition being indicative of a fault of one or more of the electrical-device components, and store the acquired data in the second memory responsive to determining that the fault condition exists, and coupling the control device to the electrical-device components, the first memory, and the second memory.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
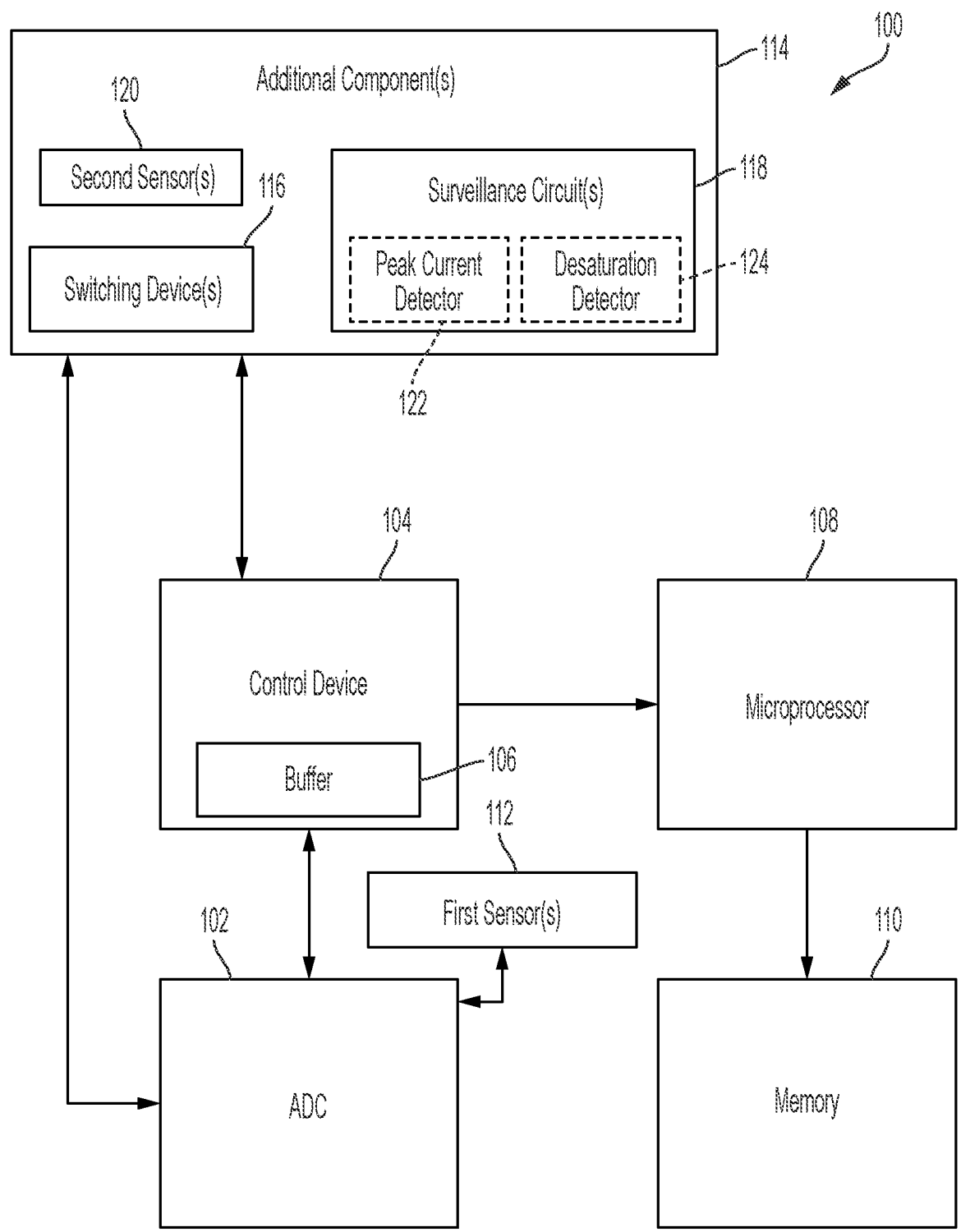
FIG. 1 illustrates a block diagram of an electrical device according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

As discussed above, certain electrical devices, such as power converters, may include one or more electrical switches configured to open and close to prevent and allow, respectively, current to pass therethrough. A control unit may control a state of each switch by providing PWM signals to each switch. Over time, one or more switches may experience a fault condition, such as by being unable to open or close in response to control signals from the control unit. Operation of an electrical device including a faulty switch may be negatively impacted by the fault condition.

In various examples, switches in a device are monitored for a fault condition. In various examples, a cause of the fault condition may be determined. Determining a cause of the fault condition may be facilitated by analyzing certain device information descriptive of the device in which the switches are implemented, such as current information, voltage information, temperature information, PWM signal information, timestamp information, and/or surveillance information indicative of a detected error condition, if any. Samples of such device information may be analyzed for a period of time before, during, and/or after the fault occurs to diagnose a cause of the fault. In some cases, device information is repeatedly sampled and stored such that, if a fault condition is detected, the device information acquired before, during, and/or after the fault condition may be analyzed to diagnose a cause of the fault. This may be easier or more practical than predicting a fault condition in advance of the fault condition occurring. However, repeatedly acquiring and storing device information may require significant storage resources.

Examples provided herein enable device information to be sampled and temporarily stored responsive to a sample condition being met. If a fault condition is thereafter detected, then the temporarily stored information may be stored on a non-temporary basis to perform root-cause analysis. For example, the information may be stored in non-volatile memory. In some examples, there are two sample conditions that prompt sampling and storage of the device information. In other examples there may be more or fewer than two sample conditions. These sample conditions may be provided in a device in which electrical switches are present. The electrical switches may be controlled based on PWM signals.

A first sample condition includes a PWM-state transition, such as from a logic HIGH value to a logic LOW value or a logic LOW value to a logic HIGH value. A second sample condition includes a threshold period of time having elapsed since device information was last acquired. In this example, therefore, device information is acquired responsive to a PWM state switching or after a threshold period of time if no PWM state switch has occurred during the threshold period of time.

The device information may initially be stored temporarily responsive to the sample condition being met. The temporarily stored device information may be transferred to non-volatile storage if a triggering event occurs, such as a fault condition being detected. For example, the device information may be temporarily stored in a first-in, first-out (FIFO) buffer such that, if the buffer is full when new device information is acquired, the oldest device information in the buffer is overwritten. A size of the buffer may be selected to store a desired amount of information to determine a cause of the fault condition. The buffer may be considered to store data "temporarily" inasmuch as stored data is overwritten shortly after being stored, unless the data is moved to other, non-volatile memory or storage for indefinite storage (for example, for storage until explicitly selected by a user for deletion). Accordingly, examples disclosed herein enable a relatively small amount of information to be repeatedly temporarily acquired and stored until a triggering event is met, responsive to which the temporarily stored information is non-temporarily stored in non-volatile memory to facilitate root-cause analysis. The amount of data stored at any one time may therefore be minimized.

Current fault-detection and/or -analysis systems may not store certain information that may be beneficial in analyzing fault conditions, or may store significant volumes of such information. Such systems may operate inefficiently, because less information may be collected than may be desirable, or so much information may be collected that memory and/or storage requirements may be significant. This is a technical problem. An exemplary embodiment of a fault-detection and/or analysis system as described herein may acquire data indicative of at least one parameter of one or more electrical-device components responsive to a sample condition being met, store the acquired data in a first memory configured to store data temporarily, and store the acquired data in non-volatile storage responsive to determining that a fault condition exists. The fault condition may be indicative of a fault of one or more of the electrical-device components. At least this foregoing combination of features comprises a fault-detection and -analysis system that serves as a technical solution to the foregoing technical problem by acquiring and storing useful information without requiring significant memory and/or storage resources. This technical solution is not routine and is unconventional. This technical solution is a practical application of the fault-detection and -analysis system design that solves the foregoing technical problem and constitutes an improvement in the technical field of electrical device systems at least by enabling faults to be analyzed effectively without requiring significant resources, such as memory and/or storage resources.

FIG. 1 illustrates a block diagram of an electrical device 100 according to an example. The electrical device 100 may include any device that operates using electrical power. For example, the electrical device 100 may be a power device, such as a power converter. In one example, a power converter may be configured to convert electrical power in a three-phase system. Each phase may have ten switching devices, such that the power converter includes 30 total switching devices. In other examples, the electrical device 100 may be a device other than a power device, and/or may include more or fewer than 30 switches.

The electrical device includes an analog-to-digital converter (ADC) 102, a control device 104 including a buffer 106, a microprocessor 108, a memory 110, which may include non-volatile memory technology such as ferroelectric random-access memory (FRAM) technology or other non-volatile memory technology, a first set of one or more sensors 112 (including, for example, temperature sensors, current sensors, voltage sensors, and so forth), and additional components 114 including one or more switching devices 116, one or more surveillance circuits 118, and a second set one or more sensors 120 (including, for example, temperature sensors, current sensors, voltage sensors, and so forth). The one or more surveillance circuits 118 include one or more circuits configured to monitor the additional components 114 for certain conditions or events, such as a peak current detector 120 configured to detect a peak current of one or more of the switching devices 116 being exceeded, a desaturation detector 122 configured to detect a desaturation condition of one or more of the switching devices 116 being experienced, and so forth. The one or more surveillance circuits 118 may send surveillance information indicative of any detected conditions or events (such as a fault condition), if any, to the control device 104. In some examples, the control device 104 may be, for example, a field-programmable gate array (FPGA), or another device configured to control a device, such as a microcontroller, application-specific integrated circuit, and so forth.

The additional components 114 may include components specific to an application of the electrical device 100. For example, where the electrical device 100 is a power module configured to provide and store electrical power, the additional components 114 may include components configured to enable or facilitate the providing and storing electrical power, including the switching devices 116. The switching devices 116 may include, for example, metal-oxide semiconductor field-effect transistors (MOSFETs), bipolar junction transistors (BJTs), insulated-gate bipolar transistors (IGBTs), or other types of switching devices, which may depend on a particular implementation of the additional components 114.

Figure 2:
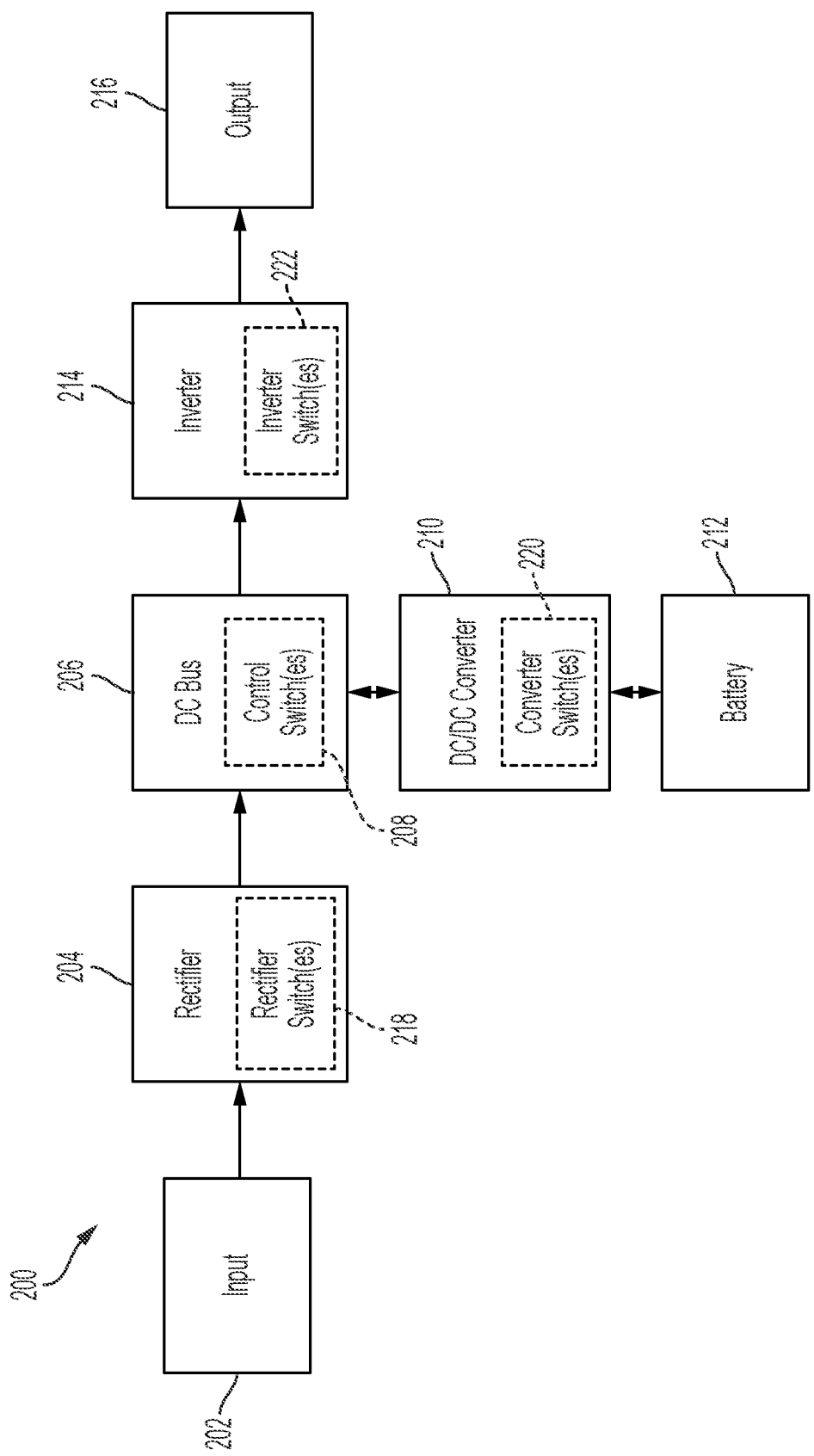
FIG. 2 illustrates a block diagram of components of a type of power module, such as an uninterruptible power supply, which may be included within the electrical device of FIG. 1 according to an example.

FIG. 2 illustrates a block diagram of components of a type of power module 200, such as an uninterruptible power supply (UPS), which may be included within the additional components 114 of FIG. 1 according to an example. FIG. 2 may illustrate only a subset of the components of the power module 200. For example, the power module 200 may be a three-phase power module, and FIG. 2 may only illustrate components of a single phase of the three phases for the sake of clarity. Other phases of the power module may be similarly configured. Accordingly, FIG. 2 may illustrate only a subset of the additional components 114 of FIG. 1.

The power module 200 includes an input 202, a rectifier 204, a direct-current (DC) bus 206 including at least one control switch 208 ("control switch 208"), a DC/DC converter 210, a battery 212, an inverter 214, and an output 216. The input 202 is configured to receive input power, such as alternating-current (AC) power from a utility mains source. The rectifier 204 is configured to rectify the input power, which may include providing power-factor correction (PFC) to the input power. The DC bus 206 is configured to conduct DC current between components connected thereto, including the rectifier 204, the inverter 214, and the DC/DC converter 210, and the control switch 208 is configured to control how the DC current passes through the DC bus 206. For example, the control switch 208 may have a first position in which DC current is provided from the rectifier 204 to the DC/DC converter 210 and/or the inverter 214, and a second position in which DC current is provided from the DC/DC converter 210 to the inverter 214. The control switch 208 may be in the first position when AC power received at the input 202 is acceptable (for example, having a voltage and/or current level within an acceptable range) and may be in the second position when AC power received at the input 202 is not acceptable (for example, having a voltage and/or current level not within an acceptable range).

The DC/DC converter 210 is configured to convert DC power from a first voltage and/or current to a second voltage and/or current. The DC/DC converter 210 may be bidirectional, such that power received from the DC bus 206 is converted and provided to the battery 212 in a first direction, and such that power received from the battery 212 is converted and provided to the DC bus 206 in a second direction. The DC/DC converter 210 may provide power to the battery 212 when the AC power received at the input 202 is acceptable, and may provide power from the battery 212 when the AC power received at the input 202 is not acceptable. The battery 212 is configured to receive electrical power from the DC/DC converter 210, store the electrical power, and discharge stored electrical power to the DC/DC converter 210. The inverter 214 is configured to receive DC power from the DC bus 206, invert the DC power to AC power, and provide the AC power to the output 216. In some examples, the battery 212 is external to, and electrically coupled to, the power module 200. For example, the power module 200 may include a power interface coupled to, or part of, the DC/DC converter 210 to enable power to be exchanged between the power module 200 and the battery 212. The output 216 provides the AC power to a device that may be connected thereto, such as a load.

As discussed above, the additional components 114 may include the switching devices 116. For example, the rectifier 204, the DC bus 206, the DC/DC converter 210, and the inverter 214 may each include one or more switching devices. More particularly, the rectifier 204 may include one or more rectifier switches 218, the DC bus 206 may include the control switch 208, the DC/DC converter 210 may include one or more converter switches 220, and the inverter 214 may include one or more inverter switches 222. The switching devices 116 may include some or all of the switches 208, 218-222.

The control device 104 may generate PWM signals and provide the PWM signals to the switching devices 116 to control the switching devices 116. One or more of the switching devices 116 may at some time experience a fault condition, which may include any condition, such as an unintended condition, that affects operation of the switching devices 116. For example, the fault condition may include a condition that negatively affects operation of the switching devices 116. Such fault conditions may include, for example, a temperature of a switching device being exceeded, or other fault conditions.

As discussed above, in various examples the fault conditions may be identified and a cause of the fault condition may be determined based on information descriptive of operation of the electrical device 100 before, during, and/or after the fault condition occurs. Electrical device information may be repeatedly acquired over time and, if a fault condition occurs, electrical device information descriptive of the electrical device 100 close in time to the fault condition may be extracted. The extracted information may be subsequently analyzed to determine, for example, a cause of the fault condition.

Figure 3:
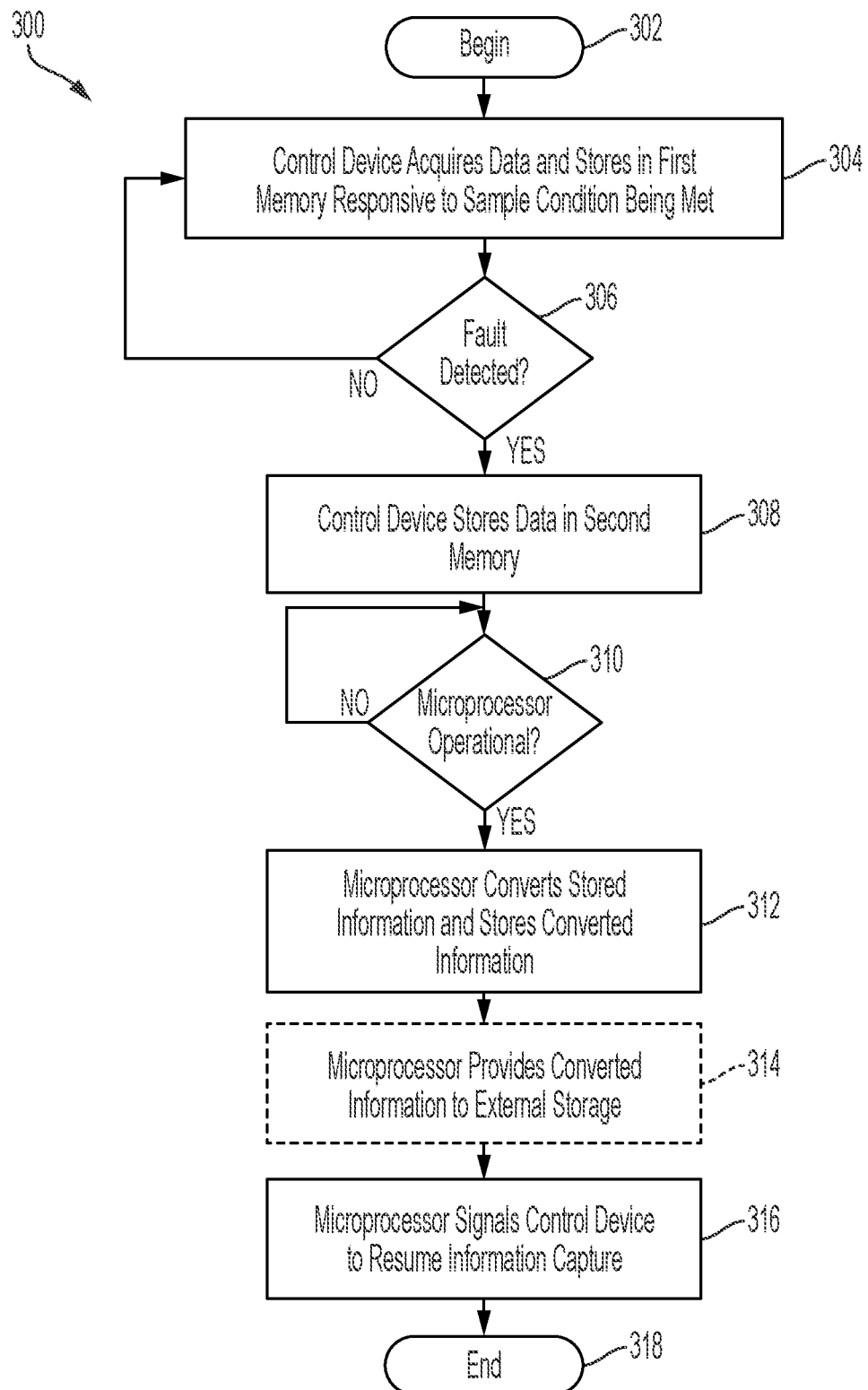
FIG. 3 illustrates a process of acquiring electrical device information to enable analysis of a cause of a fault condition of one or more switching devices according to an example.

FIG. 3 illustrates a process 300 of acquiring electrical device information to enable analysis of a cause of a fault condition of one or more switching devices according to an example. The process may be executed in connection with the electrical device 100 and components thereof, such as the switching devices 116, which may include the switches 208, 218-222.

At act 302, the process 300 begins.

At act 304, the control device 104 acquires data and stores the data in a first memory responsive to a sample condition being met. An example of act 304, including examples of sample conditions, is discussed in greater detail below with respect to FIG. 7. The first memory may be configured to store data temporarily. For example, the first memory may be the buffer 106, which may be a FIFO buffer in some examples. In other examples, the first memory may be a different type of memory or storage, such as a last-in, first-out (LIFO) buffer, a different type of temporary memory other than a buffer, a memory configured to store data non-temporarily, and so forth.

A portion of the information captured at act 304 may be acquired by the control device 104 itself and/or other components of the electrical device 100, such as the ADC 102. For example, the ADC 102 may repeatedly (for example, periodically, continuously, aperiodically, and so forth) sample one or more sensors (including, for example, the first set of one or more sensors 112, the second set of one or more sensors 120, or both) for one or more parameters of the switching devices 116 and/or the electrical device 100 as a whole. For example, where the electrical device 100 is a power module, the ADC 102 may sample a current of each phase of the output (including, for example, the output 216), a current of each phase of the input (including, for example, the input 202), a current at each pole of the battery 212, a voltage on a respective DC bus (including, for example, the DC bus 206) of each rail between each respective rectifier (including, for example, the rectifier 204) and inverter (including, for example, the inverter 212), a voltage at an input (including, for example, an AC input voltage at the input 202), a voltage at an output (including, for example, an AC output voltage at the output 216), a voltage at the battery 212, and so forth.

In some examples, the ADC 102 may sample one or more sensors to acquire each of the foregoing examples of information at act 304. In other examples, the ADC 102 may sample a subset of the one or more sensors and/or acquire a subset of the foregoing examples of information at act 304. For example, the ADC 102 may capture each of the examples of current information identified above at each execution of act 304, but may alternate between capturing different subsets of the examples of voltage information. In executing act 304 at a first time in one example, the voltage information that the ADC 102 may capture may include, for example, the voltage on the respective DC bus of each rail between each respective rectifier and inverter. In executing act 304 at a second time in one example, the voltage information that the ADC 102 may capture may include, for example, the voltage at the input. In executing act 304 at a third time in one example, the voltage information that the ADC 102 may capture may include, for example, the voltage at the output. In executing act 304 at a fourth time in one example, the voltage information that the ADC 102 may capture may include, for example, the voltage at the battery 212. In executing act 304 at a fifth time in one example, the voltage information that the ADC 102 may capture may include, for example, the voltage on the respective DC bus of each rail between each respective rectifier and inverter, as was performed at the first time. This cycle may then repeat, such that varied voltage information may be captured over time without capturing all of the voltage information at any one time. In some examples, act 304 may be repeatedly executed at a frequency that is high relative to the frequency of voltage being measured (for example, AC voltage received at the input 202). It is to be appreciated that the examples provided above are non-limiting, and that in other examples, different combinations of information may be acquired at act 304 in different orders and/or frequencies. The ADC 102 may also acquire information such as a temperature of the electrical device 100 and/or the additional components 114 from a sensor, such as a temperature sensor, of either or both of the first and second sets of sensors 112, 120. The information acquired by the ADC 102 may be converted to a digital format and provided to the control device 104. Capturing the information at act 304 may include the control device 104 controlling the ADC 102 to acquire and provide the information. In some examples, capturing the information at act 304 may include the control device 104 requesting that the ADC 102 provide the information to the control device 104. As discussed in greater detail below, the control device 104 may request the ADC information or control the ADC 102 to provide the information responsive to a period of time elapsing or a PWM-signal state change.

Figure 4:
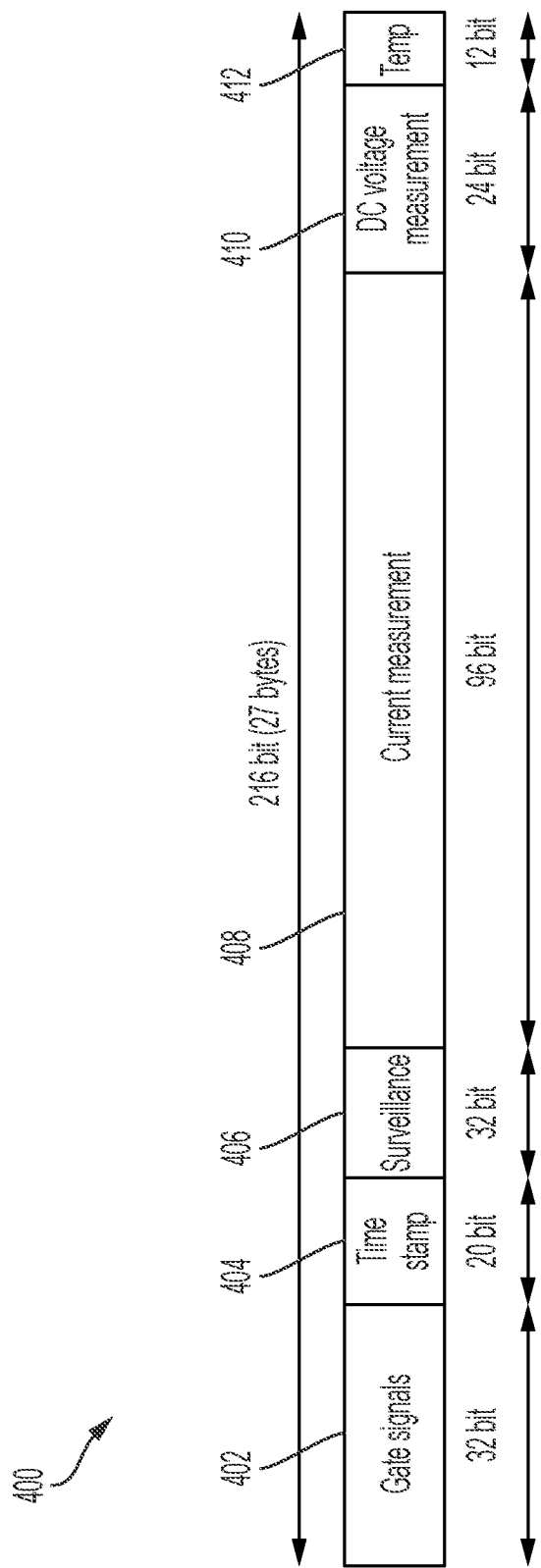
FIG. 4 illustrates a schematic diagram of a data vector according to an example.

In storing the electrical device information at act 304, the control device 104 generates a data vector. FIG. 4 illustrates an example of a data vector 400 generated by the control device 104 according to an example. The data vector 400 includes gate signal information 402, timestamp information 404, surveillance information 406, current information 408, DC voltage measurement information 410, and temperature information 412, collectively referred to as "device information." In one example, the data vector 400 is 216 bits long with the gate signal information 402 being represented by 32 bits, the timestamp information 404 being represented by 20 bits, the surveillance information 406 being represented by 32 bits, the current measurement information 408 being represented by 96 bits, the DC voltage measurement information 410 being represented by 24 bits, and the temperature information 412 being represented by 12 bits, although in other examples, the data vector 400 and portions thereof may be represented by a different number of bits and may include additional, less, or different information.

The current information 408, DC voltage measurement information 410, and temperature information 412 may be included in the information received from the ADC 102. The ADC 102, in turn, may acquire the current information 408, DC voltage measurement information 410, and temperature information 412 by sampling one or more sensors, such as the first set of one or more sensors 112, the second set of one or more sensors 120, or both. Other information in the data vector 400 may be generated or acquired by the control device 104 itself. For example, the gate signal information 402 includes information indicative of PWM signals provided by the control device 104 to the switching devices 116. The gate signal information 402 may indicate whether a PWM signal provided to each corresponding switching device was at a logical HIGH or logical LOW value when the data vector 400 was generated. The timestamp information 404 is indicative of a time at which the data vector 400 was generated. For example, the timestamp information 404 may include a clock value, a number of clock cycles which may be used to determine a clock value, or any other information that may be used to determine a time at which the data vector 400 was generated.

The surveillance information 406 indicates a fault condition, if any, detected by the one or more surveillance circuits 118 and/or the control device 104 based on information received from the one or more surveillance circuits 118, such as the peak current detector 122, the desaturation detector 124, and so forth. The control device 104 may receive the information from the ADC 102 and analyze the information to determine if a fault condition exists. For example, the control device 104 may determine that a fault condition exists based on a voltage or current value being outside of an acceptable range of values. In other examples, the control device 104 may not determine that a fault condition exists, or may not analyze the ADC information for a fault condition at all, and may instead receive the surveillance information 406 indicating whether a fault condition exists directly from the one or more surveillance circuits 118.

The control device 104 stores the data vector 400 in the first memory, which may be the buffer 106 in an example. In some examples, the buffer 106 may be configured to store multiple data vectors. The buffer 106 may be a FIFO buffer, such that if the FIFO buffer is full when the data vector 400 is stored in the FIFO buffer, an oldest data vector stored in the FIFO buffer is overwritten. A size of the FIFO buffer may be selected based on a desired number of data vectors to be stored.

Figure 9:
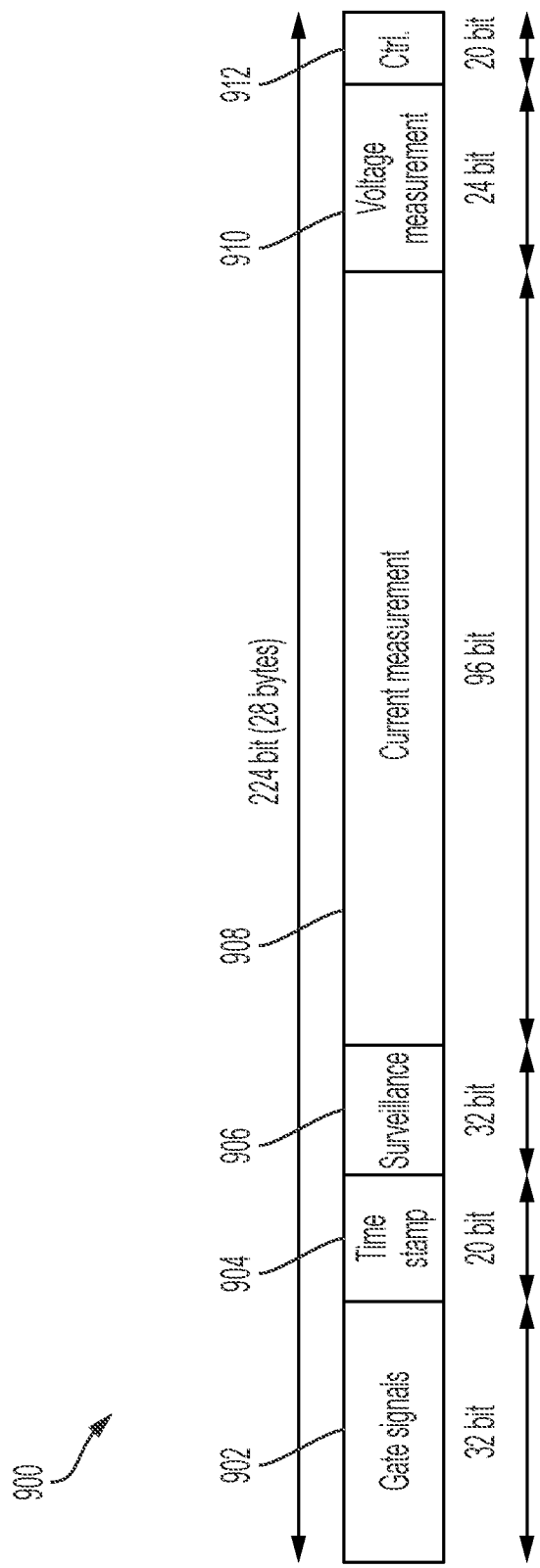
FIG. 9 illustrates a schematic diagram of a data vector according to an example.

FIG. 9 illustrates another example of a data vector 900 according to another example. The data vector 900 is similar to the data vector 400 and includes gate signal information 902, timestamp information 904, surveillance information 906, and current information 908, which may be substantially similar to the gate signal information 402, the timestamp information 404, the surveillance information 406, and the current information 408, respectively. The data vector 900 further includes voltage measurement information 910 and control information 912. The information 902-912 is collectively referred to as "device information." In one example, the data vector 900 is 224 bits long with the gate signal information 902 being represented by 32 bits, the timestamp information 904 being represented by 20 bits, the surveillance information 906 being represented by 32 bits, the current measurement information 908 being represented by 96 bits, the voltage measurement information 910 being represented by 24 bits, and the control information 912 being represented by 20 bits, although in other examples, the data vector 900 and portions thereof may be represented by a different number of bits and may include additional, less, or different information.

The information included in the voltage measurement information 910 may differ from the information included in the DC voltage measurement information 410. As discussed above, in some examples of act 304, the ADC 102 may capture different information in successive executions of act 304. For example, the ADC 102 may capture different voltage information in successive executions of act 304, such as by capturing information indicative of a DC voltage at the DC bus 206 at a first time, information indicative of an AC voltage at the input 202 at a second time, and so forth. In some examples, the ADC 102 may include, or be coupled to, a multiplexer having a plurality of inputs, each configured to receive different voltage information, such as the examples of voltage information provided above. The multiplexer may further include an output, and the multiplexer may route an input of the plurality of inputs to the output, where the output of the multiplexer may provide the voltage information 910. Accordingly, in some examples, the voltage information 910 includes voltage information that varies over time as act 304 is repeatedly executed and data vectors, such as the data vector 900, are repeatedly generated.

The information included in the control information 912 may differ from the information included in the temperature information 412. In some examples, the control information 912 may include temperature information substantially identical to what is included in the temperature information 412. The control information 912 may further include additional information. For example, where the voltage measurement information 910 includes various different types of voltage information that change over time, the control information 912 may further indicate what type of voltage information is indicated by the voltage measurement information 910, such as by indicating that the voltage measurement information 910 is indicative of an AC voltage at the input 202, an AC voltage at the output 216, and so forth. In some examples, the control information 912 may further include other information, such as information to optimize other components of the electrical device 100, including the buffer 106.

Returning to FIG. 3, after the control device 104 stores the data vector at act 304, the process 300 continues to act 306. For purposes of explanation only, the following examples may refer to aspects of the data vector 400, that is, the following examples may be provided where the data vector 400 is stored at act 304. It is to be appreciated that, in other examples, the following principles are also applicable to other types of data vectors, such as the data vector 900.

At act 306, the control device 104 determines whether a fault condition has been detected based on information in the data vector 400 (including, for example, the surveillance information 406 received from the one or more surveillance circuits 118). If a fault condition is determined not to have occurred (306 NO), then the process 300 returns to act 304. The process 300 continues until a fault condition (306 YES) is detected, at which point the process 300 continues to act 308. As discussed in greater detail below, however, the process 300 may be repeatedly executed even if a fault condition is detected (306 YES).

At act 308, the control device 104 stores the contents of the first memory in a second memory and/or storage. For example, the control device 104 may provide the contents of the buffer 106 to the microprocessor 108, and the microprocessor 108 may store the contents of the buffer 106 in the second memory. The control device 104 may provide the contents of the buffer 106 to the microprocessor 108 immediately upon determining that a fault condition exists (306 YES) or after a delay, such as after one or more sample periods. The second memory may be non-volatile memory. For example, the second memory may be or include the memory 110, which may include non-volatile memory, such as FRAM memory or another type of non-volatile memory. The control device 104 may provide the contents of the buffer 106 (for example, one or more data vectors, which may include the data vector 400 and/or the data vector 900) to the microprocessor 108 in the form that the data vector(s) were initially stored in the buffer 106, which may be referred to as a "raw" form. In other examples, the contents of the buffer 106 may be provided to the microprocessor 108 in another form, such as a converted form (for example, converted by the control device 104 prior to, during, or after storage in the buffer 106). The microprocessor 108 may store the data in the memory 110 in the raw form, or another form.

At act 310, the microprocessor 108 determines if the microprocessor 108 is operational and/or is likely to be non-operational shortly thereafter. Certain fault conditions may impact performance of the microprocessor 108. For example, a fault condition may include a failure of a switching device that controls power input at an input of the electrical device 100 as a whole, or a component thereof, such as a power supply of the microprocessor 108. Without the input power to power the microprocessor 108, the microprocessor 108 may lack electrical power to remain operational for much longer, if at all, after the fault condition occurs. If the microprocessor 108 is not operational, or is likely to not be operational for much longer because of the fault condition (310 NO), then the determination is repeatedly executed until it is determined that the microprocessor is operational and is unlikely to be non-operational shortly thereafter (310 YES). For example, if the fault condition does not affect the ability of the microprocessor 108 to remain operational, or if the fault condition has ceased occurring and is no longer adversely impacting operation of the microprocessor 108, then the microprocessor 108 may be determined to be operational (310 YES). The process 300 then continues to act 312.

At act 312, the microprocessor 108 converts the raw information stored in the memory 110 to an alternate format and stores the converted information in the same or a different memory. For example, the microprocessor 108 may convert the raw data to another format, such as a JavaScript Object Notation (JSON) file format, and store the converted data in another memory, such as a static random-access memory (SRAM) memory. Although the microprocessor 108 may convert the raw data to a format other than a JSON file format, such as a comma-separated value (CSV) file format or other file format, examples are provided with respect to a JSON file format for purposes of explanation.

In some examples, the microprocessor 108 may include additional information, along with the raw data, in the JSON file, such as serial-number information, conversion information, and/or other information. In some examples, the memory 110 may include the SRAM memory and the FRAM memory discussed above. In other examples, the memory 110 may include the SRAM memory or the FRAM memory, and the electrical device 100 may include additional memories, which may be SRAM memory, FRAM memory, or other types of memory, such as flash memory. Converting the data may include the microprocessor 108 applying a scale value for time, current, voltage, and temperature, segmenting the data for different devices to which the microprocessor 108 is connected, and exporting the data into the JSON file for storage.

At optional act 314, the microprocessor 108 may provide the converted data, which may be included in a JSON file, to another storage, which may be external storage in a device other than the electrical device 100. The converted data may be provided via a wired or wireless communication connection to the external storage. The external storage may be easily accessible for entities, such as human operators, to review the information included in the converted data to analyze a cause of the fault condition that triggered the control device 104 providing the raw data to the microprocessor 108. The electrical device 100 may provide the converted data to the external storage responsive to a device including the external storage requesting the converted data, and/or other information stored by the electrical device 100, from the electrical device 100. In another example, the electrical device 100 may send such information to the device including the external storage periodically, aperiodically, or continuously, either directly or via one or more intermediate devices, with or without a prompt, request, or command from the device.

At act 316, the microprocessor 108 signals the control device 104 to resume sampling data as discussed above with respect to act 304. For example, the microprocessor 108 may send a signal to the control device 104 to re-execute the process 300. Because the microprocessor 108 has stored the converted data in a non-volatile format, the control device 104 is free to sample additional data, which may overwrite the data stored in the buffer 106. The converted data stored by the microprocessor 108 may be provided to the external storage at any time before or after the microprocessor 108 signals the control device 104 to resume sampling data. The process 300 then ends at act 318 in some examples, although in other examples, the process 300 may not end and may instead return to act 302 or act 304 once the microprocessor 108 signals the control device 104 to resume sampling data, with the stored converted data being available to be provided to external devices automatically or by request.

Figure 5:
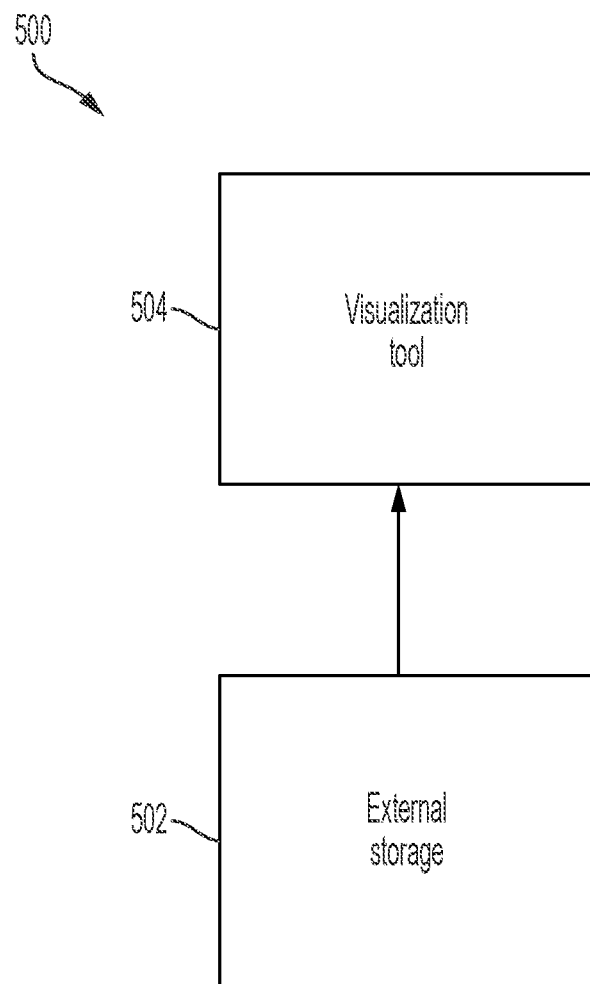
FIG. 5 illustrates a block diagram of components of a visualization system according to an example.

The converted data may be provided to external devices configured to enable operators to review determine a cause of the fault condition. For example, the external device may include a visualization system to visualize the converted data. FIG. 5 illustrates a block diagram of a visualization system 500 according to an example. The visualization system 500 includes the external storage 502 and a visualization tool 504. The external storage 502 is configured to store the JSON file and, optionally, other information indicative of a fault condition of the electrical device 100 or other electrical devices. The visualization tool 504, which may include one or more software programs, is configured to interpret information stored in the external storage 502, such as the JSON file, to generate a visualization of the information.

Figure 6:
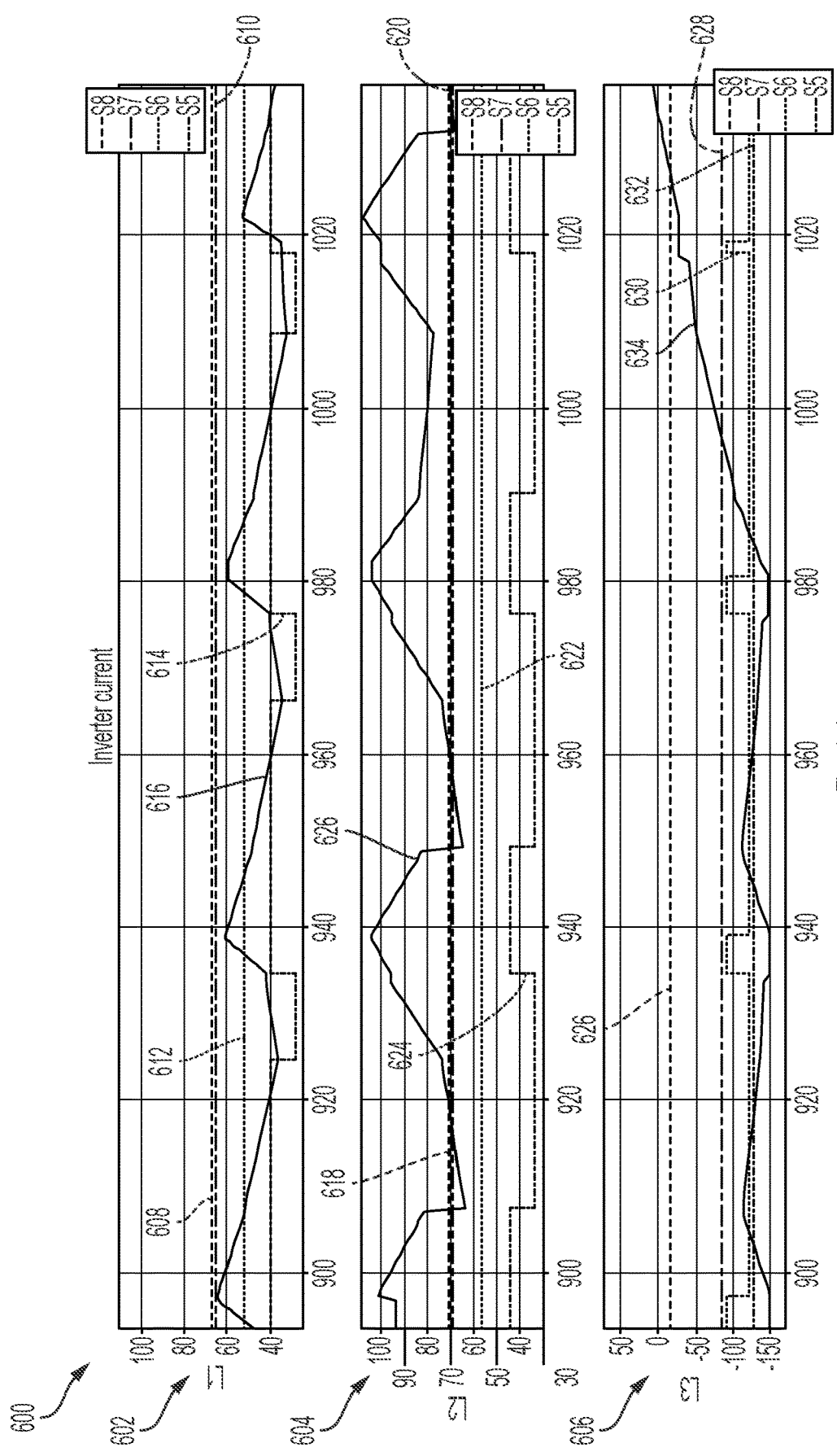
FIG. 6 illustrates a visualization of information indicative of the electrical device of FIG. 1 according to an example.

For example, FIG. 6 illustrates a visualization 600 of information that may be generated based on the JSON file. The visualization 600 illustrates an inverter current for each phase of a three-phase power device, including a first graph 602 of inverter current in an inverter of a first phase of the three-phase power device, a second graph 604 of inverter current for a second phase of the three-phase power device, and a third graph 606 of inverter current for a third phase of the three-phase power device.

The first graph 602 includes a first PWM signal trace 608 indicative of a PWM signal provided to a first switching device of an inverter in the first phase of the three-phase power device, a second PWM signal trace 610 indicative of a PWM signal provided to a second switching device of the inverter in the first phase of the three-phase power device, a third PWM signal trace 612 indicative of a PWM signal provided to a third switching device of the inverter in the first phase of the three-phase power device, a fourth PWM signal trace 614 indicative of a PWM signal provided to a fourth switching device of the inverter in the first phase of the three-phase power device, and a first current trace 616 indicative of an inverter current provided by the inverter of the first phase of the three-phase power device.

The second graph 604 includes a fifth PWM signal trace 618 indicative of a PWM signal provided to a first switching device of an inverter in the second phase of the three-phase power device, a sixth PWM signal trace 620 indicative of a PWM signal provided to a second switching device of the inverter in the second phase of the three-phase power device, a seventh PWM signal trace 622 indicative of a PWM signal provided to a third switching device of the inverter in the second phase of the three-phase power device, an eighth PWM signal trace 624 indicative of a PWM signal provided to a fourth switching device of the inverter in the second phase of the three-phase power device, and a second current trace 626 indicative of an inverter current provided by the inverter of the second phase of the three-phase power device.

The third graph 606 includes a ninth PWM signal trace 626 indicative of a PWM signal provided to a first switching device of an inverter in the third phase of the three-phase power device, a tenth PWM signal trace 628 indicative of a PWM signal provided to a second switching device of the inverter in the third phase of the three-phase power device, an eleventh PWM signal trace 630 indicative of a PWM signal provided to a third switching device of the inverter in the third phase of the three-phase power device, a twelfth PWM signal trace 632 indicative of a PWM signal provided to a fourth switching device of the inverter in the third phase of the three-phase power device, and a third current trace 634 indicative of an inverter current provided by the inverter of the third phase of the three-phase power device.

Accordingly, the visualization 600 illustrates information indicative of an inverter. For example, the visualization 600 may illustrate a current through the one or more inverter switches 222 of the inverter 212. Using the first graph 602 as an example, the first current trace 616 may indicate an inverter current received by, provided by, or internal to, the inverter 212. Each of the PWM signal traces 608-614 may indicate a PWM signal provided by the control device 104 to a respective inverter switch of the one or more inverter switches 222, which may include four inverter switches. In other examples, a visualization may illustrate any information based on the contents of the JSON file and/or other information stored in the external storage 502. For example, a visualization may include any information that may aid in analyzing a cause of a fault condition.

The examples discussed above enable device information in a data vector, the device information having been accumulated by a control device, to be repeatedly acquired. In some examples, the control device 104 may acquire the device information responsive to a sample condition being met. The device information may be stored on a temporary basis. If a fault condition is detected, for example, by a surveillance circuit, the device information may be provided to a microprocessor for non-temporary storage. The device information may subsequently be analyzed, such as by enabling an operator to view a visualization of the device information, to determine a cause of the fault condition. A cause of the fault condition may therefore be determined without storing a considerably large amount of information, at least because information may be sampled only in response to a sample condition being met, and non-transiently stored only in response to a fault condition being detected, for example.

Figure 7:
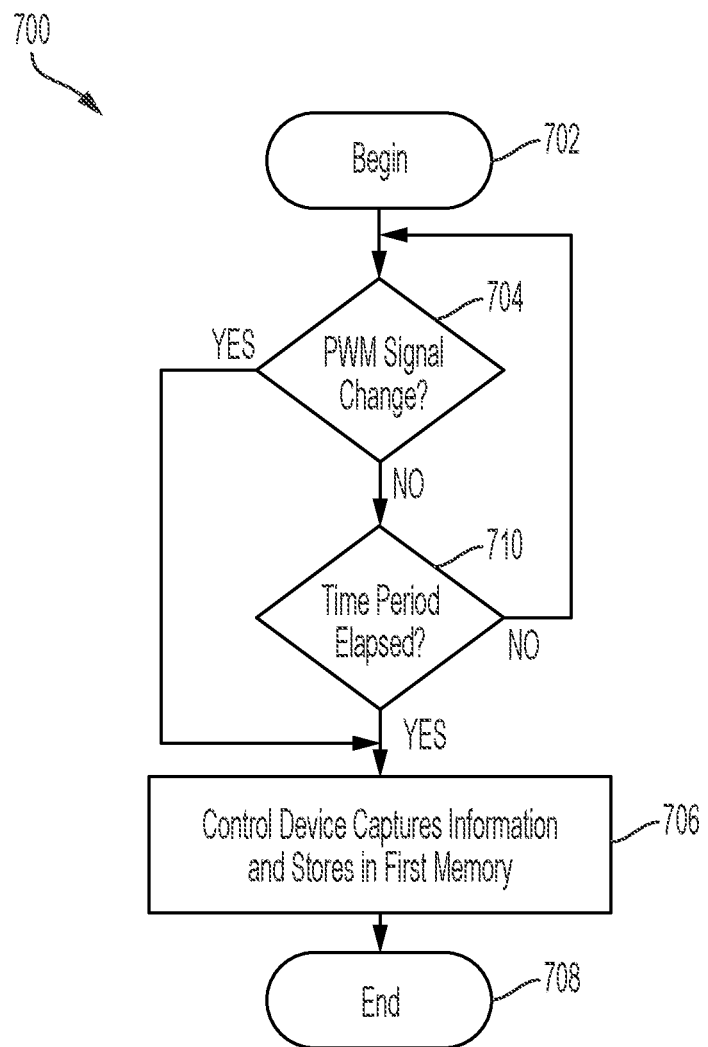
FIG. 7 illustrates a process of capturing information based on a sample condition.

FIG. 7 illustrates a process 700 of capturing device information based on a sample condition being met according to an example. As discussed above, the process 700 may be an example of act 304. For purposes of explanation, examples of the process 700 are provided with respect to FIG. 1. As discussed above, the additional components 114 may include the switching devices 116. The switching devices 116 may be configured to operate based on PWM signals received from the control device 104. For example, the additional components 114 may include 30 switching devices configured to operate based on PWM signals received from the control device 104.

At act 702, the process 700 begins.

At act 704, the control device 104 may determine whether a PWM signal change has occurred. A PWM signal change may include a PWM signal provided by the control device 104 transitioning from a logical HIGH level to a logical LOW level, or from a logical LOW level to a logical HIGH level, or both. The signal change may be a signal change of any of the PWM signals provided by any of the 30 example switching devices in some examples. If a PWM signal change has been detected (704 YES), then the process 700 continues to act 706.

At act 706, the control device 104 captures device information and stores it in the first memory (for example, the buffer 106) as a data vector, as discussed above with respect to act 304. Capturing the device information at act 706 may include determining a time at which the control device 104 captures the device information. The process 700 then ends at act 708. In examples in which the process 700 is an example of act 304, the process 300 may then continue to act 306.

Returning to act 704, if the control device 104 determines that a PWM signal change has not occurred (704 NO), then the process 700 continues to act 710.

At act 710, the control device 104 determines whether a time period has elapsed since the control device 104 most recently captured device information. As discussed above with respect to act 706, the control device 104 may determine a time at which device information is captured each time the control device 104 captures device information. Accordingly, at act 710, the control device 104 determines whether a time between a present time and the time at which the device information was most recently captured meets or exceeds the time period. The time period may be a specified time period, such as 2 μs or another time period. If the time period has not yet elapsed (710 NO), then the process 700 returns to act 704. Otherwise, if the time period has elapsed (710 YES), then the process 700 continues to act 706. As discussed above, at act 706, the control device 104 captures device information and stores it in the first memory (for example, the buffer 106) as a data vector. The process 700 then ends at act 708, which may include the process 300 continuing to act 306.

Accordingly, in this example, the control device 104 captures device information each time a PWM signal change occurs or, if no signal change occurs within a specified time period, at the end of the time period. A data vector containing the device information, such as the data vector 400, may then be temporarily stored in a memory, such as the buffer 106, with other data vectors including previously captured device information.

Figure 8:
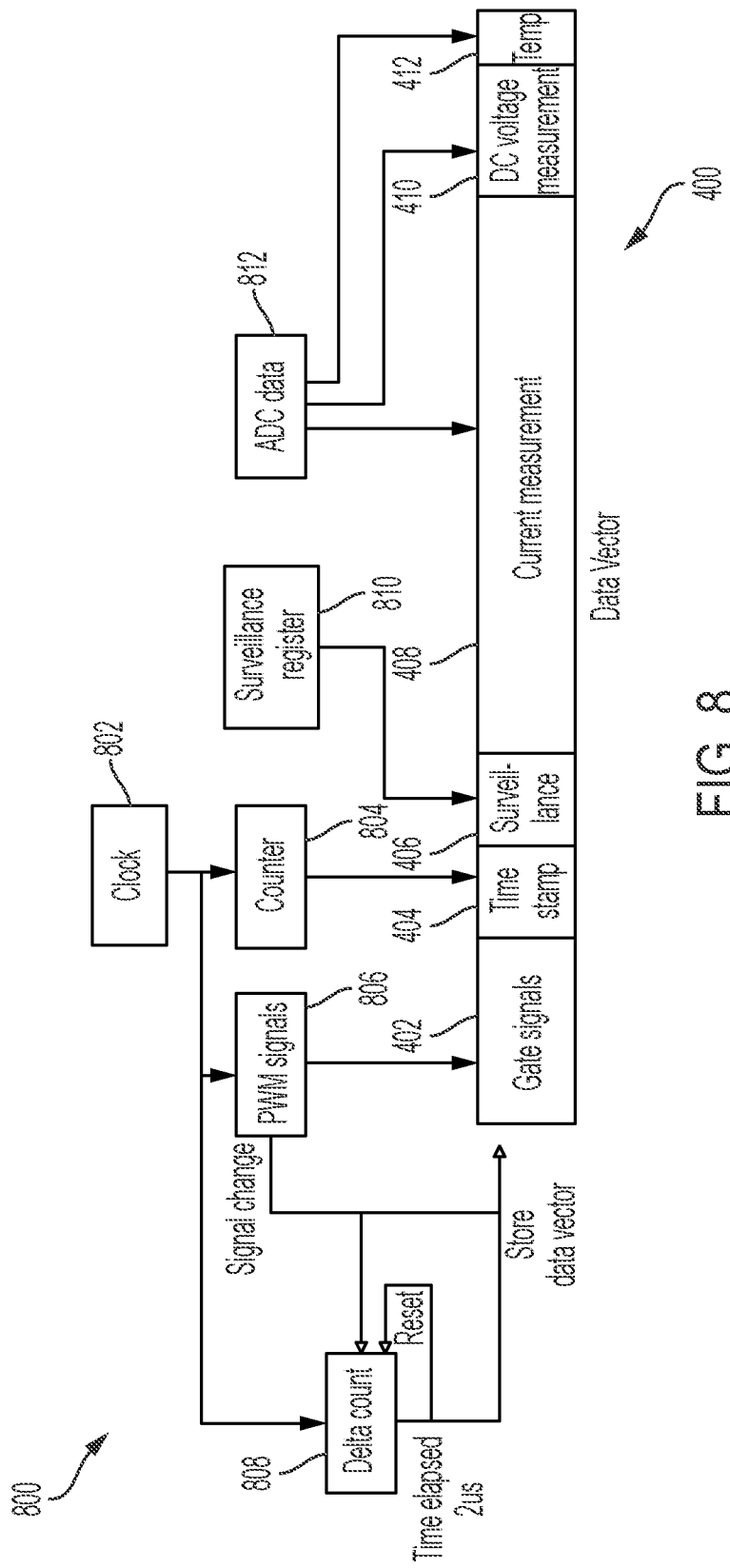
FIG. 8 illustrates a schematic view of a data-vector-generation scheme according to an example.

FIG. 8 illustrates a schematic view of a data vector generation scheme 800 implemented by the control device 104 to generate the data vector 400 according to an example. The control device 104 may be driven by a clock signal generated by a clock 802, which may be included within the control device 104 or may be coupled to the control device 104. In some examples, the clock signal has a period of 20 ns. The clock signal may be provided to a counter 804 and a delta count module 808, and may be used (for example, by the control device 104) to generate the PWM signals 806, such as by determining a period of each of the PWM signals 806. The counter 804 is configured to provide a timestamp signal when the data vector 400 is generated, the timestamp signal being indicative of, or used to generate, the timestamp information 404. The timestamp signal, which may include a counter value, may be used to determine an absolute time value. The PWM signals 806 may be generated based on the clock signal, which may provide a signal resolution of the PWM signals. The delta count module 808 is configured to determine an elapsed time period since the delta count module 808 count was most recently reset.

The delta count module 808 generates a command to store a data vector each time the delta count module 808 determines that the elapsed time period since the delta count module 808 was most recently reset has reached a specified time period, such as 2 μs, and each time one of the PWM signals 806 changes state. Acts 704 and 710 of the process 700, above, discuss these features. The command to store the data vector 400 commands the delta count module 808 to reset a count, and also commands the control device 104 to store the data vector 400.

As discussed above, the data vector 400 includes gate signal information 402, timestamp information 404, surveillance information 406, current measurement information 408, DC voltage measurement information 410, and temperature information 412. The gate signal information 402 may be provided by the control device 104 itself, which provides the PWM signals. The timestamp information 404 may be provided by the counter 804. The surveillance information 406 may be provided by a surveillance register 810, which may be a component of, and indicate a status of, the control device 104, such as the presence or absence of a fault condition. The surveillance register 810 may store information received from the one or more surveillance circuits 118. The current measurement information 408, DC voltage measurement information 410, and temperature information 412 may be provided by the ADC 102 by sampling one or more sensors, such as the first set of one or more sensors 112 and/or the second set of one or more sensors 120. For example, the control device 104 may request that the ADC 102 to provide the current measurement information 408, DC voltage measurement information 410, and temperature information 412 responsive to the command to store the data vector 400. In another example, the ADC 102 may provide the current measurement information 408, DC voltage measurement information 410, and temperature information 412 independently of the command to store the data vector 400, but the control device 104 may use the received current measurement information 408, DC voltage measurement information 410, and temperature information 412 to generate the data vector 400 responsive to the command to store the data vector 400.

Figure 10:
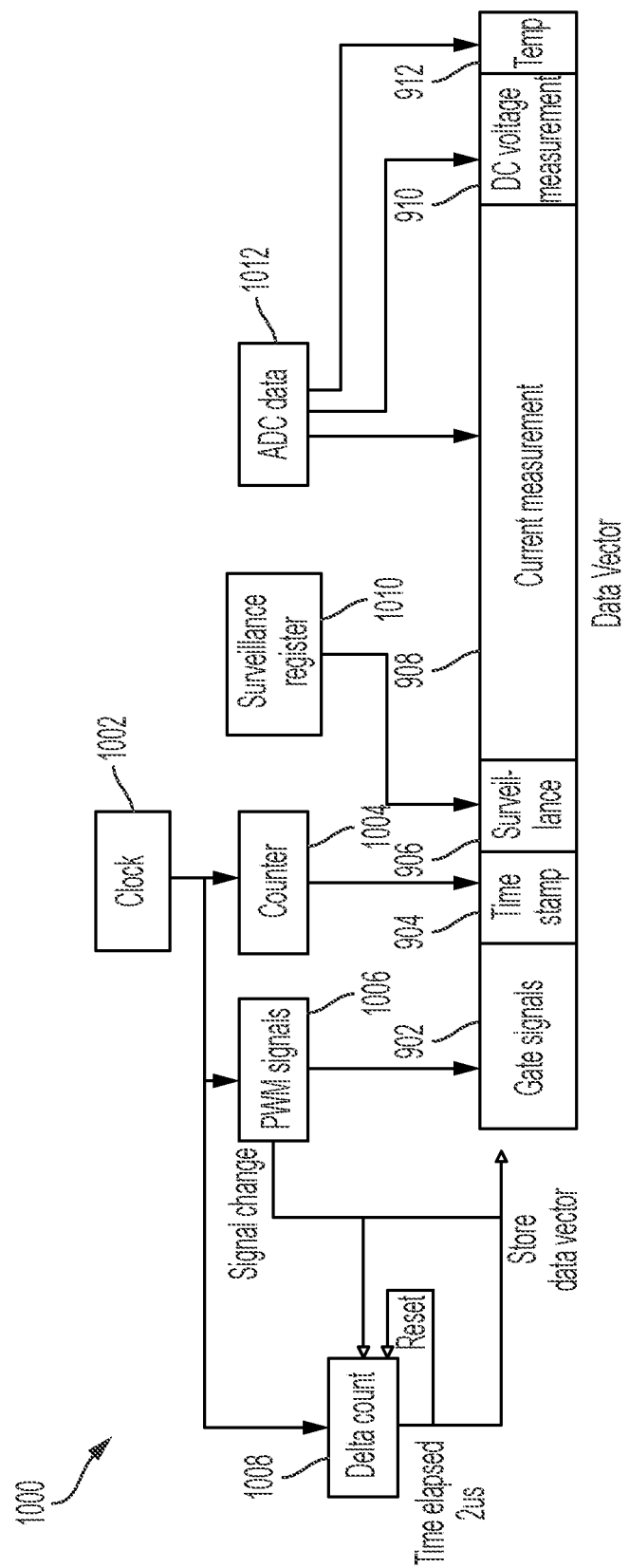
FIG. 10 illustrates a schematic view of a data-vector-generation scheme according to an example.

FIG. 10 illustrates a schematic view of a data vector generation scheme 1000 implemented by the control device 104 to generate the data vector 900 according to an example. The data vector generation scheme 1000 may be substantially similar to the data vector generation scheme 800. For example, the clock 1002, the counter 1004, the PWM signals 1006, the delta count module 1008, and the surveillance register 1010 may be substantially similar to the clock 802, the counter 804, the PWM signals 806, the delta count module 808, and the surveillance register 810, respectively. The data vector generation scheme 100 may further include ADC data 1012, which may be substantially similar to the ADC data 812, except that the ADC data 1012 is used to generate the voltage measurement information 910 which, as discussed above, may differ from the DC voltage measurement information 410. The ADC data 1012, and the data vector generation scheme 1000 as a whole, may otherwise be substantially similar to the ADC data 412 and data vector generation scheme 800, respectively.

In some examples, the data vector 400 and/or the data vector 900 may include additional, less, and/or different information than that indicated in the examples above. Each portion of the data vector 400 and/or data vector 900 may have a different length than in the examples provided above. Although certain memory and storage components have been referred to herein, it is to be appreciated that the memory and storage components may be implemented with alternate technologies than those specifically mentioned. Furthermore, in some examples, examples of volatile memory may instead be implemented by non-volatile memory components.

As discussed above, act 710 may include determining whether a time period has elapsed since device information was most recently acquired. In some examples, act 710 may alternately or additionally include determining whether a time period has elapsed since the process 700 began. For example, when the control device 104 executes the process 700 for the first time, the control device 104 has not previously acquired device information and thus may be unable to determine whether a time period has elapsed since any device information was most recently acquired. Determining whether a time period has elapsed since the process 700 began may thus serve a substantially similar purpose as determining whether a time period has elapsed since device information was most recently acquired.

Although certain examples may include three-phase power modules, examples discussed herein may be implemented in connection with different devices, including single-phase power modules and devices other than power modules. Information acquired and/or stored by an FPGA, or a device operating in a similar manner as the control device 104 discussed above, such as may sample information responsive to one of two sample conditions, or a different number of sample conditions, which may be the same conditions as those discussed above or may include different, fewer, or additional conditions.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An electrical device comprising:
   electrical-device components including one or more switching devices;
   a first memory configured to store data temporarily;
   a second memory, the second memory being non-volatile memory; and
   a control device configured to:
      provide pulse-width modulation (PWM) signals to the one or more switching devices;
      acquire data indicative of at least one parameter of at least one electrical-device component of the electrical-device components responsive to a sample condition being met, wherein the sample condition includes a transition in at least one PWM signal of the PWM signals;
      store the acquired data in the first memory;
      determine that a fault condition exists based on the acquired data, the fault condition being indicative of a fault of one or more of the electrical-device components; and
      store the acquired data in the second memory responsive to determining that the fault condition exists.

2. The electrical device of claim 1, wherein the first memory is a buffer.

3. The electrical device of claim 2, wherein the buffer is a first-in, first-out buffer.

4. The electrical device of claim 1, wherein the second memory includes ferroelectric random-access memory.

5. The electrical device of claim 1, wherein the fault condition is indicative of a fault of at least one of the one or more switching devices.

6. The electrical device of claim 1, wherein the sample condition includes a threshold period of time elapsing since previously acquired data indicative of the at least one parameter of the at least one electrical-device component was most recently acquired by the control device.

7. The electrical device of claim 1, further comprising a microprocessor configured to provide the acquired data to a visualization system to analyze the fault condition.

8. The electrical device of claim 1, wherein the electrical-device components include a peak-current detector, and wherein the fault condition includes a peak current being exceeded.

9. The electrical device of claim 1, wherein the electrical-device components include a desaturation detector, and wherein the fault condition includes a desaturation condition being detected.

10. The electrical device of claim 1, wherein the acquired data indicative of the at least one parameter of the at least one electrical-device component includes at least one of current data, voltage data, or temperature data.

11. The electrical device of claim 10, wherein the acquired data includes current data, and wherein the current data is indicative of a current through each switching device of the one or more switching devices.

12. The electrical device of claim 10, wherein the acquired data includes voltage data, and wherein the voltage data is indicative of a voltage across each switching device of the one or more switching devices.

13. The electrical device of claim 10, wherein the acquired data includes temperature data, and wherein the temperature data is indicative of an ambient temperature of the at least one electrical-device component of the electrical-device components.

14. A non-transitory computer-readable medium storing thereon sequences of computer-executable instructions for operating an electrical device having electrical-device components including one or more switching devices, a first memory configured to store data temporarily, and a second memory, the second memory being non-volatile memory, and the sequences of computer-executable instructions including instructions that instruct at least one device to:
   provide pulse-width modulation (PWM) signals to the one or more switching devices;
   acquire data indicative of at least one parameter of at least one electrical-device component of the electrical-device components responsive to a sample condition being met, the sample condition including a transition in at least one PWM signal of the PWM signals;
   store the acquired data in the first memory;
   determine that a fault condition exists based on the acquired data, the fault condition being indicative of a fault of one or more of the electrical-device components; and
   store the acquired data in the second memory responsive to determining that the fault condition exists.

15. The non-transitory computer-readable medium of claim 14, wherein the sample condition being met includes a threshold period of time elapsing since previously acquired data indicative of the at least one parameter of the at least one electrical-device component was most recently acquired.

16. The non-transitory computer-readable medium of claim 14, wherein the fault condition includes a peak current being exceeded.

17. The non-transitory computer-readable medium of claim 14, wherein the fault condition includes a desaturation condition being detected.

18. A method of operating an electrical device having electrical-device components including one or more switching devices, a first memory configured to store data temporarily, and a second memory, the second memory being non-volatile memory, the method comprising:
   providing pulse-width modulation (PWM) signals to the one or more switching devices;
   acquiring data indicative of at least one parameter of at least one electrical-device component of the electrical-device components responsive to a sample condition being met, the sample condition including a transition in at least one PWM signal of the PWM signals;

storing the acquired data in the first memory;
determining that a fault condition exists based on the acquired data, the fault condition being indicative of a fault of one or more of the electrical-device components; and
storing the acquired data in the second memory responsive to determining that the fault condition exists.

19. The method of claim 18, wherein the fault condition includes a desaturation condition being detected.

20. The method of claim 18, wherein the fault condition includes a peak current being exceeded.

* * * * *